(12) United States Patent
Lee et al.

(10) Patent No.: US 8,799,332 B2
(45) Date of Patent: Aug. 5, 2014

(54) CONTENT CONVERSION APPARATUS AND METHOD

(75) Inventors: Hyun-Jeong Lee, Daejeon (KR); Jung-Sik Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 203 days.

(21) Appl. No.: 13/325,571

(22) Filed: Dec. 14, 2011

(65) Prior Publication Data

US 2012/0147260 A1 Jun. 14, 2012

(30) Foreign Application Priority Data

Dec. 14, 2010 (KR) .................. 10-2010-0127815

(51) Int. Cl.
*G06F 15/16* (2006.01)
*G06F 7/00* (2006.01)
*G06F 17/30* (2006.01)
*H03M 7/30* (2006.01)
*G06F 9/54* (2006.01)

(52) U.S. Cl.
CPC ............. *G06F 17/30* (2013.01); *H03M 7/30* (2013.01); *G06F 9/541* (2013.01)
USPC ........................... 707/809; 709/247

(58) Field of Classification Search
None
See application file for complete search history.

(56) References Cited

U.S. PATENT DOCUMENTS

| | | | | |
|---|---|---|---|---|
| 7,606,909 B1 * | 10/2009 | Ely et al. | ............ | 709/227 |
| 8,127,011 B2 * | 2/2012 | Monette | ............ | 709/226 |
| 2006/0041431 A1 * | 2/2006 | Maes | ............ | 704/270.1 |
| 2007/0049333 A1 * | 3/2007 | Jeong et al. | ............ | 455/556.1 |
| 2007/0079010 A1 * | 4/2007 | Heredia et al. | ............ | 709/246 |
| 2007/0160350 A1 * | 7/2007 | Ikeda et al. | ............ | 386/99 |
| 2007/0291106 A1 * | 12/2007 | Kenrick et al. | ............ | 348/14.01 |
| 2008/0107170 A1 * | 5/2008 | Ong et al. | ............ | 375/240.01 |
| 2008/0208607 A1 * | 8/2008 | Ma et al. | ............ | 705/1 |
| 2008/0298237 A1 * | 12/2008 | Dos Remedios et al. | ...... | 370/233 |
| 2010/0005183 A1 * | 1/2010 | Ding et al. | ............ | 709/229 |
| 2010/0257569 A1 * | 10/2010 | O'Hanlon | ............ | 725/110 |
| 2010/0268836 A1 * | 10/2010 | Jabri et al. | ............ | 709/231 |

(Continued)

FOREIGN PATENT DOCUMENTS

EP 2111008 A1 10/2009
KR 1020070059887 6/2007

(Continued)

OTHER PUBLICATIONS

Dahab et al., Two Approaches to Pay-per-use Software Construction, IEEE 2000.*

*Primary Examiner* — Tarek Chbouki
*Assistant Examiner* — Karina Levitian
(74) *Attorney, Agent, or Firm* — Nelson Mullins Riley & Scarborough LLP; Anthony A. Laurentano, Esq.

(57) ABSTRACT

Disclosed herein is a content conversion apparatus and method. The content conversion apparatus includes a table generation unit for generating a media dependent table and a weight table. An information management unit receives information about a terminal and information about a player of the terminal from the terminal and manages the received information. A content conversion unit generates a content information table, related to content that is to be converted, using the media dependent table, the weight table, the terminal information and the player information, and converts the content using the content information table so as to transmit converted content to the terminal.

20 Claims, 8 Drawing Sheets

(56) References Cited

U.S. PATENT DOCUMENTS

2011/0125809 A1* 5/2011 Woods et al. .................. 707/809
2012/0044985 A1* 2/2012 Tao et al. .................. 375/240.01
2012/0206645 A1* 8/2012 Ozawa ....................... 348/425.3
2012/0232911 A1* 9/2012 Wu et al. ........................ 704/500
2013/0276034 A1* 10/2013 O'Hanlon ....................... 725/61

FOREIGN PATENT DOCUMENTS

| KR | 1020090115958 | 11/2009 |
| KR | 1020090121949 | 11/2009 |
| KR | 1020090128195 | 12/2009 |
| WO | 2007/066980 A1 | 6/2007 |

* cited by examiner

FIG.3

| | 301 | 302 | 303 | 304 | 305 | 306 | 307 | 308 | 309 | 310 | 311 |
|---|---|---|---|---|---|---|---|---|---|---|---|
| [0] | V_codec | V_codec_weight | V_mode | V_mode_flag | V_bit_rate_min | V_bit_rate_max | V_bit_rate_flag | V_mode_vbr_min | V_mode_vbr_max | V_mode_vbr_flag | V_frame_rate_min |
| | V_frame_rate_max | V_frame_rate_flag | V_resolution | V_resolution_flag | V_aspect | V_aspect_flag | A_codec | A_codec_flag | File_format | File_format_flag | |
| | 312 | 313 | 314 | 315 | 316 | 317 | 318 | 319 | 320 | 321 | |

| | | | | | | | | | | | |
|---|---|---|---|---|---|---|---|---|---|---|---|
| [b-1] | ... | ... | V_mode | V_mode_flag | V_bit_rate_min | V_bit_rate_max | V_bit_rate_flag | V_mode_vbr_min | V_mode_vbr_max | V_mode_vbr_flag | V_frame_rate_min |
| | V_frame_rate_max | V_frame_rate_flag | V_resolution | V_resolution_flag | V_aspect | V_aspect_flag | A_codec | A_codec_flag | File_format | File_format_flag | |

FIG. 4

| | 401 A_codec | 402 A_codec_ weight | 403 A_sample_ rate_ min | 404 A_sample_ rate_ max | 405 A_bit_ rate_ min | 406 A_bit_ rate_ max | 407 A_ channels | 408 File_ format | 409 V_codec |
|---|---|---|---|---|---|---|---|---|---|
| [0] | A_codec | A_codec_weight | A_sample_rate_min | A_sample_rate_max | A_bit_rate_min | A_bit_rate_max | A_channels | File_format | V_codec |
| .. | .. | .. | .. | .. | .. | .. | .. | .. | .. |
| [c-1] | A_codec | A_codec_weight | A_sample_rate_min | A_sample_rate_max | A_bit_rate_min | A_bit_rate_max | A_channels | File_format | V_codec |

FIG.5

| VIDEO CODEC | FREE | | FILE FORMAT COMPATIBILITY | | TOTAL SCORE | RANKING |
|---|---|---|---|---|---|---|
| | FREE OR CHARGED | WEIGHT | NUMBER OF SUPPORTABLE FILE FORMATS | WEIGHT | | |
| Xvid | 1 | 3 | 6 | 1 | 9 | 1 |
| Divx4 | 1 | | 6 | | 9 | 2 |
| Divx5 | 0 | | 6 | | 6 | 3 |
| Mpeg-1 | 0 | | 6 | | 6 | 4 |
| Mpeg-2 | 0 | | 6 | | 6 | 5 |
| Mpeg-4 | 0 | | 6 | | 6 | 6 |
| Wmv7 | 0 | | 6 | | 6 | 7 |
| Wmv8 | 0 | | 6 | | 6 | 8 |
| H.264 | 0 | | 5 | | 5 | 9 |
| H.263 | 1 | | 1 | | 4 | 10 |

FIG.6

| AUDIO CODEC | FREE | | FILE FORMAT COMPATIBILITY | | TOTAL SCORE | RANKING |
|---|---|---|---|---|---|---|
| | FREE OR CHARGED | WEIGHT | NUMBER OF SUPPORTABLE FILE FORMATS | WEIGHT | | |
| Ogg | 1 | 3 | 3 | 1 | 6 | 1 |
| MP3 | 0 | | 5 | | 5 | 2 |
| AAC | 0 | | 5 | | 5 | 3 |
| FLAC | 1 | | 2 | | 5 | 4 |
| WMA | 0 | | 4 | | 4 | 5 |
| RealAudio | 0 | | 1 | | 1 | 6 |

FIG. 7

| | 701 | 702 | 703 | 704 | 705 | 706 | 707 | 708 | 709 | 710 | 711 |
|---|---|---|---|---|---|---|---|---|---|---|---|
| [0] | Diff_key | Service_key | Player_key | File_format | V_codec | V_codec_weight | V_mode | V_mode_flag | V_bit_rat_min | V_bit_rat_max | V_bit_rate_flag |
| | 712 | 713 | 714 | 715 | 716 | 717 | 718 | 719 | 720 | 721 | 722 |
| | V_mode_vbr_min | V_mode_vbr_max | V_mode_vbr_flag | V_frame_rate_min | V_frame_rate_max | V_frame_rate_flag | V_resolution | V_resolution_flag | V_aspect | V_aspect_flag | A_codec |
| | 723 | 724 | 725 | 726 | 727 | 728 | | | | | |
| | A_codec_weight | A_sample_rate_min | A_sample_rate_max | A_bit_rate_min | A_bit_rate_max | A_channels | | | | | |

| | 701 | 702 | 703 | 704 | 705 | 706 | 707 | 708 | 709 | 710 | 711 |
|---|---|---|---|---|---|---|---|---|---|---|---|
| [d-1] | Diff_key | Service_key | Excc_key | File_format | V_codec | V_codec_weight | V_mode | V_mode_flag | V_bit_rat_min | V_bit_rat_max | V_bit_rate_flag |
| | V_mode_vbr_min | V_mode_vbr_max | V_mode_vbr_flag | V_frame_rate_min | V_frame_rate_max | V_frame_rate_flag | V_resolution | V_resolution_flag | V_aspect | V_aspect_flag | A_codec |
| | A_codec_weight | A_sample_rate_min | A_sample_rate_max | A_bit_rate_min | A_bit_rate_max | A_channels | | | | | |

FIG.8

| | 801 | 802 | 803 | 804 | 805 | 806 | 807 | 808 | 809 | 810 |
|---|---|---|---|---|---|---|---|---|---|---|
| [0] | Diff_key | Service_key | Player_key | Dec_unique_id | File_format | V_codec | V_mode | V_bit_rate | V_mode_vbr | V_frame_rate |
| | 811 | 812 | 813 | 814 | 815 | 816 | | | | |
| | V_resolution | V_aspect | A_codec | A_sample_rate | A_bit_rate | A_channels | | | | |
| ... | ... | ... | ... | ... | ... | ... | ... | ... | ... | ... |
| [e-1] | Diff_key | Service_key | Player_key | Dec_unique_id | File_format | V_codec | V_mode | V_bit_rate | V_mode_vbr | V_frame_rate |
| | V_resolution | V_aspect | A_codec | A_sample_rate | A_bit_rate | A_channels | | | | |

FIG.9

CONTENT CONVERSION APPARATUS AND METHOD

CROSS REFERENCE TO RELATED APPLICATION

This application claims the benefit of Korean Patent Application No. 10-2010-0127815, filed on Dec. 14, 2010, which is hereby incorporated by reference in its entirety into this application.

BACKGROUND OF THE INVENTION

1. Technical Field

The present invention relates generally to a content conversion apparatus and method and, more particularly, to a content conversion apparatus and method, which convert content attributes, such as a file format, a video codec and an audio codec that are not supported by a terminal, depending on information about the terminal and information about the player of the terminal, and then provide the content of which attributes are converted so that the content attributes are supported by the terminal, thus enabling multimedia content services to be provided regardless of the type of terminal.

2. Description of the Related Art

With the remarkable development of mobile terminals, various types of mobile terminals have recently appeared and are being used. As iPhone including AppStore has appeared, the field of mobile terminals has taken on a new aspect. However, since these various types of mobile terminals have hardware performance such as the size, resolution or color level of a mounted screen and computing system ability, and various software characteristics such as supported codecs and the installed media player, the compatibility of content between terminals is very low at present. In these circumstances, the case where a terminal does not support a codec and content is not played when a user uses the content frequently occurs. That is, due to hardware and software characteristics differing between individual mobile terminals and the characteristics of players or the like installed in the mobile terminals, the types of codecs supported by the terminals are different, and thus each terminal does not support the playing of all types of content. For example, there occurs the case where a video that can be played on a mobile terminal which uses Microsoft Window Mobile Operating System (OS) cannot be played on the iPhone terminal of Apple. In this case, when playing the relevant video is attempted, the message "insupportable codec" may be displayed. Some codecs may be downloaded over the Internet and then installed and used. In contrast, several codecs may not be supported at all. Therefore, a problem may arise in that it is impossible to, in this situation, share content among terminals or continuously use content while moving the terminals.

SUMMARY OF THE INVENTION

Accordingly, an object of the present invention is to provide a content conversion apparatus and method, which convert content attributes, such as a file format, a video codec and an audio codec that are not supported by a terminal, depending on information about the terminal and information about the player of the terminal, and then provide the content of which attributes are converted so that the content attributes are supported by the terminal, thus enabling multimedia content services to be provided regardless of the type of terminal.

In order to accomplish the above object, the present invention provides a content conversion apparatus, including a table generation unit for generating a media dependent table and a weight table; an information management unit for receiving information about a terminal and information about a player of the terminal from the terminal and managing the received information; and a content conversion unit for generating content information tables, related to content that is to be converted, using the media dependent table, the weight table, the terminal information and the player information, and converting the content using the content information table so as to transmit converted content to the terminal.

Preferably, the content conversion unit may generate a player-based content information table using the media dependent table, the weight table and the player information, generate a terminal-based content information table using the player-based content information table and the terminal information, and convert the content using the terminal-based content information table.

Preferably, the table generation unit may generate the media dependent table including a file format-based media dependent table, a video codec-based media dependent table, and an audio codec-based media dependent table, and generate a weight table including a video codec-based weight table and an audio codec-based weight table.

Preferably, the content conversion apparatus may further include an interface unit for communicating with a server that provides the content and with the terminal.

Further, the present invention provides a content conversion method, including generating a media dependent table and a weight table; receiving information about a terminal and information about a player of the terminal from the terminal and managing the received information; generating content information tables, related to content that is to be converted, using the media dependent table, the weight table, the terminal information and the player information; converting the content using the content information table; and transmitting converted content to the terminal.

Preferably, the converting the content may include generating a player-based content information table using the media dependent table, the weight table and the player information; generating a terminal-based content information table using the player-based content information table and the terminal information; and converting the content using the terminal-based content information table.

Preferably, the generating the media dependent table and the weight table may include generating a media dependent table including a file format-based media dependent table, a video codec-based media dependent table, and an audio codec-based media dependent table; and generating a weight table including a video codec-based weight table and an audio codec-based weight table.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The present invention will be described in detail below with reference to the accompanying drawings. In the following description, redundant descriptions and detailed descriptions of known functions and elements that may unnecessarily make the gist of the present invention obscure will be omitted. Embodiments of the present invention are provided to fully describe the present invention to those having ordinary knowledge in the art to which the present invention pertains. Accordingly, in the drawings, the shapes and sizes of elements may be exaggerated for the sake of clearer description.

Figure 1:
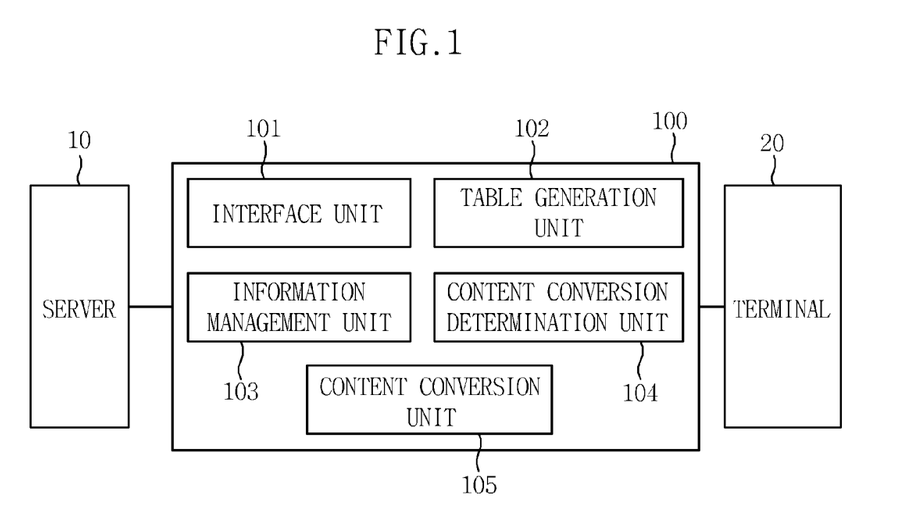
FIG. 1 is a diagram schematically showing a content conversion apparatus according to an embodiment of the present invention.

FIG. 1 is a diagram schematically showing a content conversion apparatus according to an embodiment of the present invention.

Referring to FIG. 1, a content conversion apparatus 100 according to an embodiment of the present invention functions to convert content between a server 10 that provides content and a terminal 20 that plays the content. In FIG. 1, although the content conversion apparatus is shown as being provided separately from the server 10 and the terminal 20, the content conversion apparatus may be implemented to be included either in the server 10 or in the terminal 20 in another embodiment. In this case, the server 10 may include all types of servers capable of providing content, and the terminal 20 may include all types of terminal devices capable of playing content, such as a desktop computer, a laptop computer, a smart phone, a Portable Multimedia Player (PMP), and a portable game console.

Referring to FIG. 1, the content conversion apparatus 100 according to the embodiment of the present invention may include an interface unit 101, a table generation unit 102, an information management unit 103, a content conversion determination unit 104, and a content conversion unit 105. The content conversion apparatus 100 of FIG. 1 is exemplarily shown and may be configured such that some components are added, deleted or modified depending on the circumstances. For example, in another embodiment, the content conversion apparatus may be configured to include the table generation unit 102, the information management unit 103, the content conversion determination unit 104 and the content conversion unit 105 without including the interface unit 101. In a further embodiment, the content conversion apparatus may be configured without including the content conversion determination unit 104. In yet another embodiment, the content conversion apparatus may be configured without including both the interface unit 101 and the content conversion determination unit 104.

The interface unit 101 is a unit for performing communication between the server 10 that provides the content and the terminal 20. The server 10 and the terminal 20 may exchange data including both content, existing before being converted by the interface unit 101, and converted content, therebetween.

The table generation unit 102 generates both a media dependent table and a weight table. The media dependent table is a table generated based on dependent relationships among the file format, video codec and audio codec of media, and may include a file format-based media dependent table, a video codec-based media dependent table, and an audio codec-based media dependent table. The media dependent table may be used by the content conversion determination unit 104 to determine whether the conversion of content is required, whether the conversion of content is supported, and whether the conversion of content is possible, and may be used by the content conversion unit 105 to convert content.

The weight table is a table in which weights are assigned depending on the characteristics of respective video codecs or audio codecs supported by the content conversion unit 105, and may include a video codec-based weight table and an audio codec-based weight table. Therefore, the table generation unit 102 may generate the media dependent table including the file format-based media dependent table, the video codec-based media dependent table, and the audio codec-based media dependent table, and may generate the weight table including the video codec-based weight table and the audio codec-based weight table. The weight table may be used by the content conversion unit 105 to convert content.

The three types of media dependent tables and the two types of weight tables will be described in detail below with reference to the attached drawings.

The information management unit 103 receives information about the terminal 20 and information about the player of the terminal 20 from the terminal 20, and manages the received information. The information management unit 103 may receive the terminal information and the player information of the terminal 20, which are required to convert content, via the interface unit 101 and may function to manage the received terminal information and player information.

The content conversion determination unit 104 determines whether the conversion of content is required, whether the conversion of the content is supported, and whether the conversion of content is possible. The content to be played by the terminal 20 is primarily input by a user and is then selected by the server 10. The content conversion determination unit 104 determines whether the conversion of content is required, is supported, and is possible, for the selected content. Whether the conversion of the content is required is related to determining whether the conversion of the content is needed because the selected content is not supported by the terminal 20. Whether the conversion of the content is supported is related to determining whether a content conversion function is supported even when the selected content needs to be converted. Whether the conversion of the content is possible is related to determining whether the conversion of the selected content is possible by extracting the attributes of the selected content even when the conversion of the selected content is needed and the conversion of the content is supported. The content conversion determination unit 104 can check these articles using the media dependent table generated by the table generation unit 102.

The content conversion unit 105 generates a content information table related to content that is to be converted, using the media dependent table, the weight table, the terminal information and the player information, and converts the content using the content information table so as to transmit the converted content to the terminal 20. The content information table is a table including information about content so as to convert the content, and may include a player-based content information table and a terminal-based content information table. In an embodiment, the content conversion unit 105 may generate the player-based content information table using the media dependent table, the weight table and the player information, generate the terminal-based content information table using the player-based content information table and the terminal information, and convert the content using the terminal-based content information table. The player-based content information table and the terminal-based content information table will be described in detail below with reference to the attached drawings.

Figure 2:
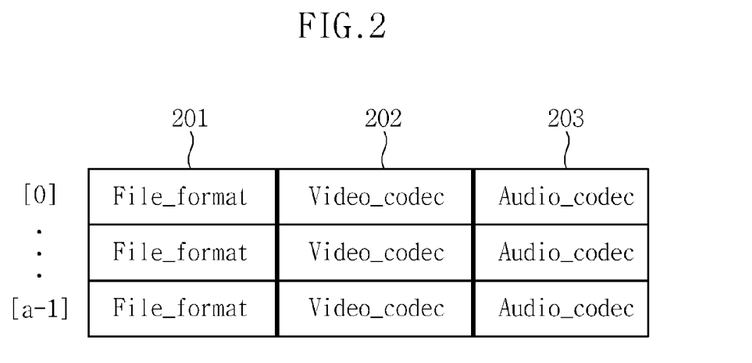
FIGS. 2 to 4 are diagrams schematically showing media dependent tables generated by the table generation unit of the content conversion apparatus according to an embodiment of the present invention.
Figure 3:
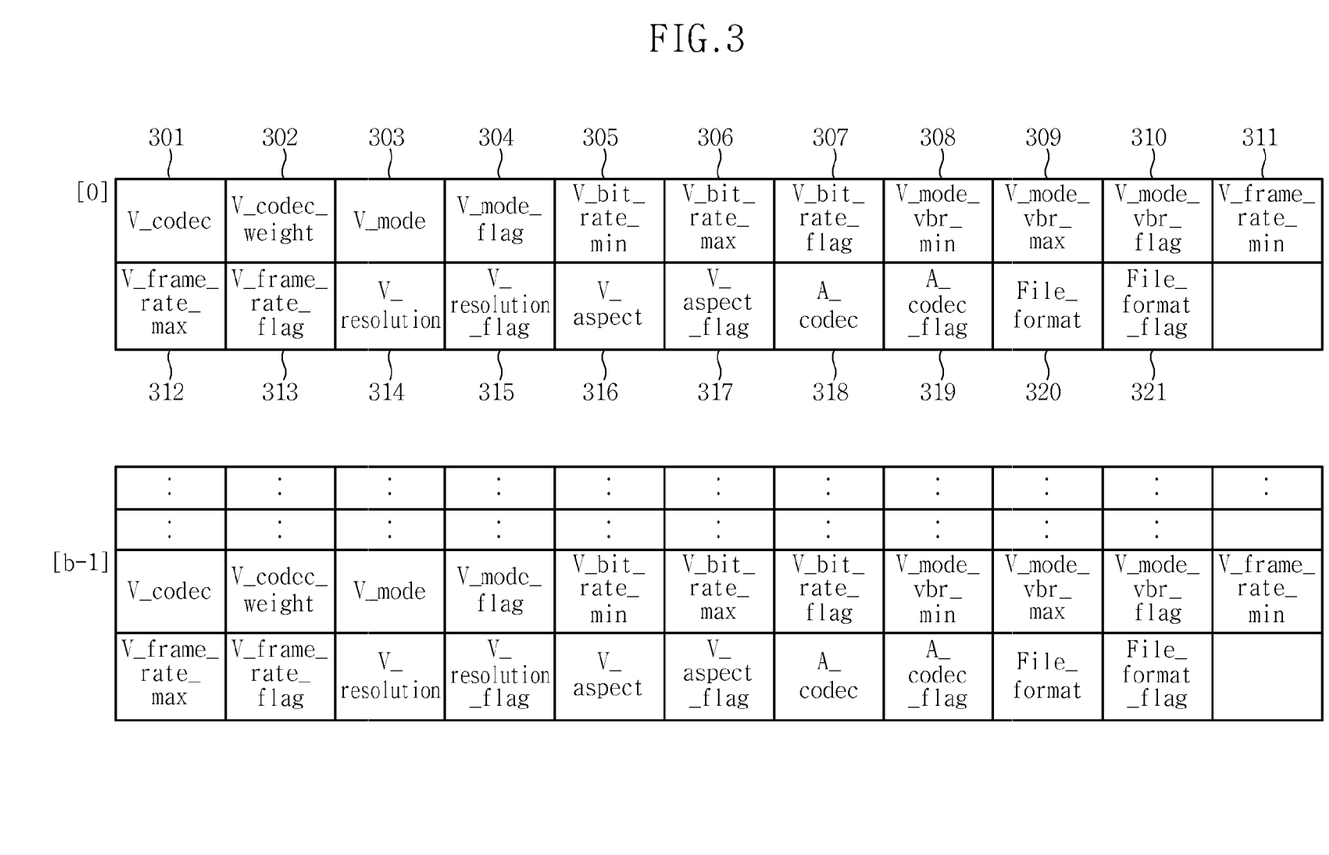
Figure 4:
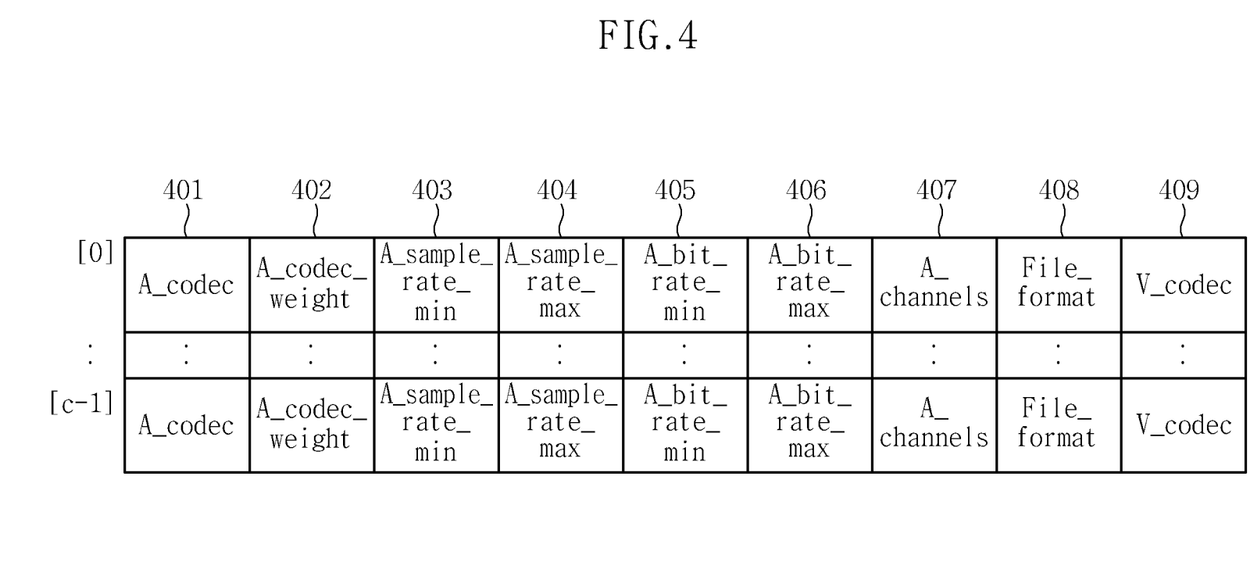

FIGS. 2 to 4 are diagrams schematically showing media dependent tables generated by the table generation unit of the content conversion apparatus according to an embodiment of the present invention.

The media dependent tables shown in FIGS. 2 to 4 may be used when the content conversion determination unit determines whether the conversion of content is supported. The media dependent tables of FIGS. 2 to 4 are exemplarily shown, and those skilled in the art will appreciate that the media dependent tables may be configured to include components different from those of FIGS. 2 to 4 in other embodiments.

FIG. 2 is a diagram showing an example of a file format-based media dependent table.

Referring to FIG. 2, the file format-based media dependent table may be generated as a table composed of 'a' rows corresponding to the number of file formats. Content may be composed of file format 201, video codec 202, audio codec 203, or a part of these components, wherein the individual components have dependent relationships thereamong. Therefore, in FIG. 2, for each file format, a video codec 202 and an audio codec 203 which support that file format are primarily arranged into a table.

FIG. 3 illustrates an example of a video codec-based media dependent table.

Referring to FIG. 3, a table composed of 'b' rows corresponding to the number of video codecs supported by the content conversion unit is generated. In order to determine whether the conversion of content is possible, the attributes of content conversion are extracted. In this case, whether the conversion of content is possible is determined using a procedure for primarily extracting video codecs and audio codecs for each file format of a file format-based media dependent table, subsequently extracting the respective characteristics of the extracted video codecs, and extracting audio codecs suitable for the extracted file format and video codecs and the characteristics of the audio codecs. In FIGS. 3 and 4, each flag indicates whether dependency on a relevant codec is present. In the case of the flag, when dependency on the codec is present, the codec attribute values of FIG. 3 are used regardless of whether attribute values supported by each flag-related player have been input or not. Further, when attribute values supported by each flag-related player are present and dependency on the codec is not present, the attribute values supported by the player are used. Furthermore, when the attribute values supported by each flag-related player are not present and dependency on the codec is not present, the original content values are used.

The video codec-based media dependent table of FIG. 3 includes video attribute values, audio attribute values and file format attribute values. The video attribute values include one or more of a video codec (V_codec) 301, a video codec weight (V_codec_weight) 302, a video mode (V_mode) 303, a video mode flag (V_mode_flag) 304, a minimum video bit rate value (V_bit_rate_min) 305, a maximum video bit rate value (V_bit_rate_max) 306, a video bit rate flag (V_bit_rate_ flag) 307, a minimum video mode variable bit rate (VBR) value (V_mode_vbr_min) 308, a maximum video mode variable bit rate value (V_mode_vbr_max) 309, a video mode variable bit rate flag (V_mode_vbr_flag) 310, a minimum video frame rate value (V_frame_rate_min) 311, a maximum video frame rate value (V_frame_rate_max) 312, a video frame rate flag (V_frame_rate_flag) 313, a video resolution (V_resolution) 314, a video resolution flag (V_resolution_ flag) 315, a video aspect ratio (V_aspect) 316, and a video aspect ratio flag (V_aspect_flag) 317. The audio attribute values include one or more of an audio codec (A_codec) 318 and an audio codec flag (A_codec_flag) 319. The file format attribute values include one or more of a file format (File_format) 320 and a file format flag (File_format_flag) 321.

The video codec-based media dependent table shown in FIG. 3 includes the video codec 301, and video characteristics and audio codecs which are dependent on that video codec. The video codec 301 indicates video codecs supported by the content conversion unit. The video codec weight 302 indicates the value required to select the most suitable video codec when there are several video codecs supporting content conversion, and an example thereof is illustrated in the video codec-based weight table. The video mode 303 indicates Average Bit Rate (ABR), Constant Bit Rate (CBR), 2—Pass or 3—pass mode. The video mode flag 304 indicates whether the video mode 303 has dependency on the video codec 301. Each of the minimum video bit rate value 305 and the maximum video bit rate value 306 indicates a video bit rate ranging from a minimum of 0 kbps to a maximum of 20,000 kbps, and their default values are 200 kbps. The video bit rate flag 307 indicates whether the video bit rate has dependency on the video codec 301. Each of the minimum video mode VBR value 308 and the maximum video mode VBR value 309 indicates a range from a minimum of 0% to a maximum of 100% which is the range of VBR values of the video mode, and the video mode VBR flag 310 indicates whether the video mode VBR has dependency on the video codec 301. The minimum video frame rate value 311 and the maximum video frame rate value 312 respectively indicate the minimum value and the maximum value of frame rates per second for video, such as 23.976, 24, 25, 29.97, and 30. The video frame rate flag 313 indicates whether the video frame rate has dependency on the video codec 301. The video resolution 314 indicates resolution such as 320*240 and 640*480, and the video resolution flag 315 indicates whether the video resolution has dependency on the video codec 301. The video aspect ratio 316 indicates the aspect ratio of a video displayed on a screen, such as 4:3, 16:9, and 2.21:1. The video aspect ratio flag 317 indicates whether the video aspect ratio has dependency on the video codec 301. The audio codec 318 indicates a list of audio codecs supporting the relevant video codec 301, and the audio codec flag 319 indicates whether such an audio codec has dependency on the video codec 301. The file format 320 indicates the list of file formats supporting the relevant video codec 301, and the file format flag (File_format_flag) 321 indicates whether the file format has dependency on the video codec 301.

FIG. 4 illustrates an example of the audio codec-based media dependent table.

Referring to FIG. 4, a table composed of 'c' rows corresponding to the number of audio codecs supported by the content conversion unit is generated as the audio codec-based media dependent table. Unlike FIG. 3, the table of FIG. 4 does not have values indicating dependency. The reason for this is that the all of individual audio characteristics are generated as having dependency on the audio codecs.

The audio codec-based media dependent table of FIG. 4 may include audio attribute values, file format (File_format)

408, and video codec (V_codec) 409. The audio attribute values include one or more of an audio codec (A_codec) 401, an audio codec weight (A_codec_weight) 402, a minimum audio sample rate value (A_sample_rate_min) 403, a maximum audio sample rate value (A_sample_rate_max) 404, a minimum audio bit rate value (A_bit_rate_min) 405, a maximum audio bit rate value (A_bit_rate_max) 406, and the number of audio channels (A_channels) 407.

The audio codec 401 indicates audio codecs supported by the content conversion unit. The audio codec weight 402 indicates the value required to select the most suitable audio codec when there are several audio codecs supporting content conversion, and an example of the audio codec weight is illustrated in the audio codec-based weight table. Each of the minimum audio sample rate value 403 and the maximum audio sample rate value 404 indicates values ranging from a minimum of 0 kHz to a maximum of 48,000 kHz. Each of the minimum and maximum audio bit rate values 405 and 406 ranges from a minimum of 0 kbps to a maximum of 1,024 kbps. The number of audio channels (A_channels) 407 indicates the number of audio channels. The file format (File_format) 408 indicates a list of file formats supporting such an audio codec, and the video codec (V_codec) 409 indicates a list of video codecs supporting the audio codec.

Figure 5:
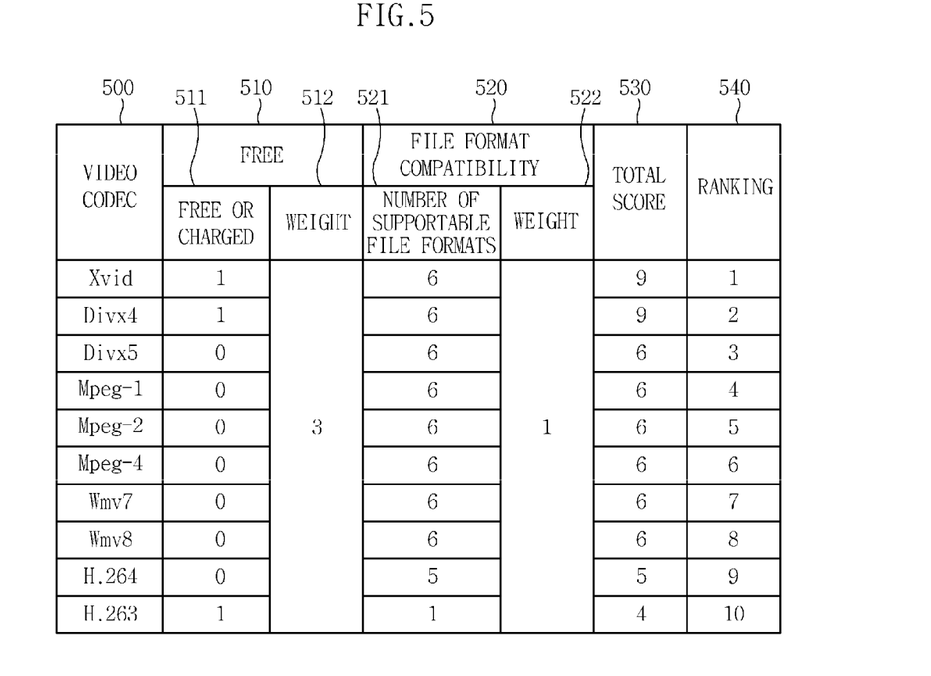
FIGS. 5 and 6 are diagrams schematically showing weight tables generated by the table generation unit of the content conversion apparatus according to an embodiment of the present invention.
Figure 6:
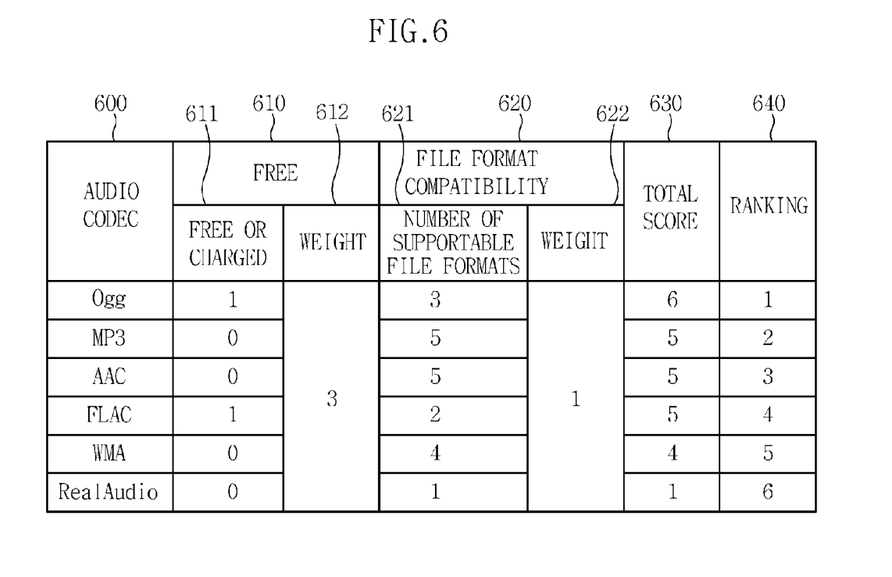

FIGS. 5 and 6 are diagrams schematically showing weight tables generated by the table generation unit of the content conversion apparatus according to an embodiment of the present invention.

The weight tables shown in FIGS. 5 and 6 may be used when the content conversion unit converts content. The weight tables shown in FIGS. 5 and 6 are exemplarily shown, and those skilled in the art will appreciate that the weight tables may be configured to include components different from those of FIGS. 5 and 6 in other embodiments.

FIG. 5 illustrates an example of a video codec-based weight table.

The video codec-based weight table of FIG. 5 may include one or more of information about being free or charged for 511, a weight 512 related to being free or charged for, the number of supportable file formats 521, and a weight 522 related to the number of supportable file formats.

Referring to FIG. 5, scores for a total of four items such as the information about being free or charged for 511, the weight 512 related to being free or charged for, the number of supportable file formats 521, and the weight 522 related to the number of supportable file formats, are given to each of 10 video codecs 500, so that the total score 530 of each video codec is calculated, and the ranking 540 of the codecs is indicated. In this case, the number of video codecs 500 is merely exemplary, and is not limited to that of the example of FIG. 5. Further, the information about being free or charged for 511 and the weight 512 related to being free or charged for correspond to free information 510, and the number of supportable file formats and the weight 522 related to the number of supportable file formats correspond to file format compatibility information 520. Here, the file formats used in the number of supportable file formats 521 include a total of six kinds such as QuickTime, AVI, Matroska, MP4, MXF and OGM. If all of these file formats are supported, the weight 522 becomes six points. This file format can be regenerated and used depending on the circumstances. Here, the weight 512 related to being free or charged for and the weight 522 related to the number of supportable file formats are exemplified as 3 points and 1 point, respectively, but, if necessary, those points can be adjusted and the ranking of the video codecs can be changed.

FIG. 6 illustrates an example of an audio codec-based weight table.

Referring to FIG. 6, similarly to the video codec-based weight table of FIG. 5, scores for a total of four items such as information about being free or charged for 611, weight 612 related to being free or charged for, the number of supportable file formats 621, and weight 622 related to the number of supportable file formats, are given to each of 6 audio codecs 600, so that the total score 630 of each audio codec is calculated, and the ranking 640 of the codecs is indicated. Further, the information about being free or charged for 611 and the weight 612 related to being free or charged for correspond to free information 610, and the number of supportable file formats 621 and the weight 622 related to the number of supportable file formats correspond to file format compatibility information 620. In this case, the number of audio codecs 600 is merely exemplary, and is not limited to that of the example of FIG. 6. Here, the file formats used in the number of supportable file formats 621 include a total of five kinds such as QuickTime, AVI, Matroska, MP4, and MXF. If all of these file formats are supported, the weight 622 becomes five points. This file format can be regenerated and used depending on the circumstances. Here, similarly to the video codec-based weight table of FIG. 5, the weight 612 related to being free or charged for and the weight 622 related to the number of supportable file formats are exemplified as 3 points and 1 point, respectively, but, if necessary, those points can be adjusted and the ranking of the audio codecs can be changed.

Figure 7:
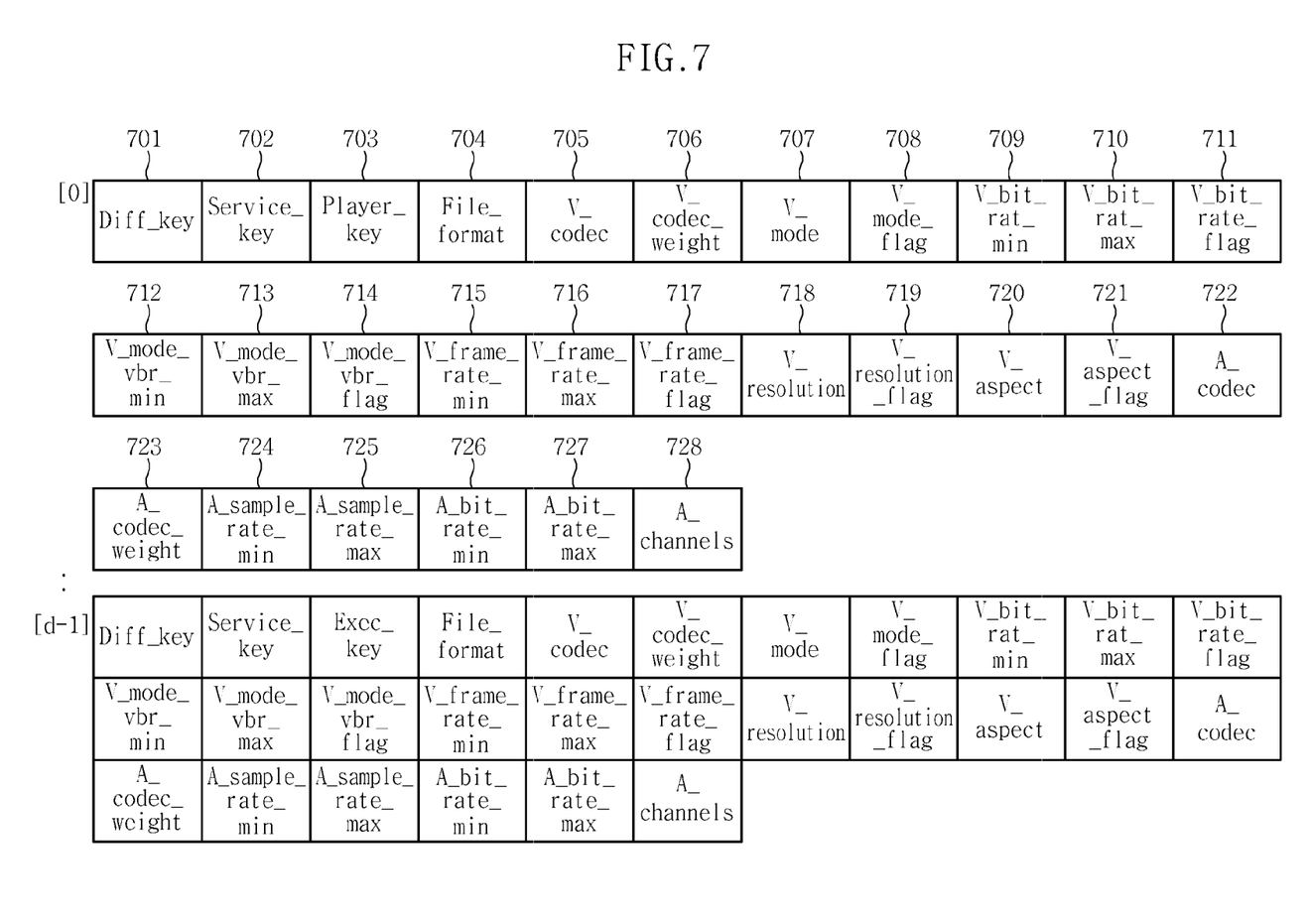
FIGS. 7 and 8 are diagrams schematically showing content information tables generated by the content conversion unit of the content conversion apparatus according to an embodiment of the present invention.
Figure 8:
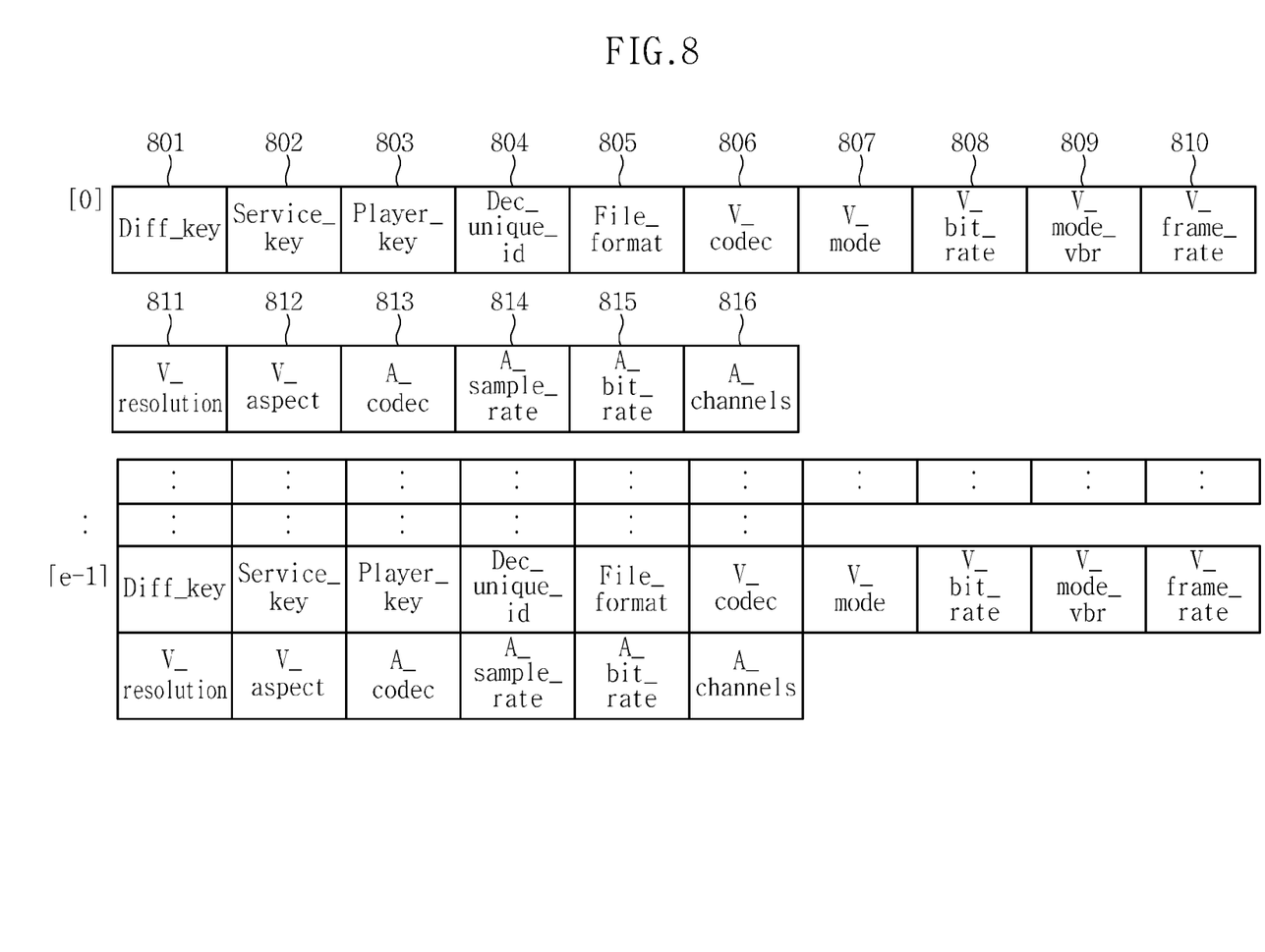

FIGS. 7 and 8 are diagrams schematically showing content information tables generated by the content conversion unit of the content conversion apparatus according to an embodiment of the present invention.

The content information tables shown in FIGS. 7 and 8 can be used when the content conversion unit converts content. The content information tables shown in FIGS. 7 and 8 are exemplarily illustrated, and those skilled in the art will appreciate that the content information tables may be configured to include components different from those of FIGS. 7 and 8 in other embodiments.

FIG. 7 illustrates an example of a player-based content information table.

The player-based content information table shown in FIG. 7 may be periodically registered, modified or deleted in accordance with the registration, modification or deletion of one or more of a service profile, a service comparison rule, a player, a player comparison rule, and a terminal profile.

Referring to FIG. 7, the player-based content information table includes related information, video attribute values and audio attribute values. The related information includes one or more of a comparison result key (Diff_key) 701, a service key (Service_key) 702, a player key (Player_key) 703, and a file format (File_format) 704. The video attribute values include one or more of a video codec (V_codec) 705, a video codec weight (V_codec_weight) 706, a video mode (V_mode) 707, a video mode flag (V_mode_flag) 708, a minimum video bit rate value (V_bit_rate_min) 709, a maximum video bit rate value (V_bit_rate_max) 710, a video bit rate flag (V_bit_rate_flag) 711, a minimum video mode variable bit rate value (V_mode_vbr_min) 712, a maximum video mode variable bit rate value (V_mode_vbr_max) 713, a video mode variable bit rate flag (V_mode_vbr_flag) 714, a minimum video frame rate value (V_frame_rate_min) 715, a maximum video frame rate value (V_frame_rate_max) 716, a video frame rate flag (V_frame_rate_flag) 717, a video resolution (V_resolution) 718, a video resolution flag (V_resolution_flag) 719, a video aspect ratio (V_aspect) 720, and a video aspect ratio flag (V_aspect_flag) 721. The audio attributable values include one or more of an audio codec (A_codec) 722, an audio codec weight (A_codec_weight) 723, a minimum audio sample rate value (A_sample_rate_min) 724, a maximum audio sample rate value (A_sample_rate_max) 725, a minimum audio bit rate value (A_bit_rate_min) 726, a maximum audio bit rate value (A_bit_rate_max) 727, and an audio channel (A_channels) 728.

The comparison result key 701 is the value required to store a difference between an item supported by the player so that the content is played and an item required by a content service, that is, an item required by the server that provides the content, in a file and to cause the file to be accessed. This file can be used to determine whether the conversion of content is supported. The service key 702 indicates a key for the content service selected by the user, and the player key 703 indicates the value required to identify each player. The file format 704 indicates the file format of the content, and is information required to convert the original file format into a file format supported by the player. The video codec 705 indicates video codecs supporting the file format 704, and is information required to convert the original file format into a video codec supported by the player. When there are several file formats supported by the player, a number of tables identical to that of FIG. 7 are generated to correspond to the number of combinations of video codecs and audio codecs that support each of the file formats. Thereafter, the video codec weight 706 through the video aspect ratio flag 721 which correspond to video codec-related information are implemented such that the video codec-based dependent table is compared to video codec information supported by the player, and overlapping values belonging to the intersection therebetween are used, or such that when there are no overlapping values, values supported by the player are used. In the case where the values supported by the player are not generated, if dependency on the video codec is present, the values of the video codec are used, whereas if dependency on the video codec is not present, the attribute values of the original content are used. Values of the audio codec 722 through the audio channel 728 are set in a similar manner to that used for the video codec. That is, the audio codec-based media dependent table is compared to audio codec information supported by the player. If there are overlapping values belonging to the intersection therebetween, those overlapping values are used, whereas if there are no overlapping values, values supported by the player are used. In the case where the values supported by the player are not generated, audio codec values generated in the audio codec-based media dependent table are used. Here, a difference between the attribute values of the video codec and the attribute values of the audio codec means that the attribute values of the video codec may occasionally not have dependency on the video codec, but all of the attribute values of the audio codec are generated as having dependency on the audio codec.

FIG. 8 illustrates an example of a terminal-based content information table.

The terminal-based content information table of FIG. 8 stores values that are used as parameters input at the time of converting content with reference to the table of FIG. 7, and allows one of various values and values falling within a relevant range to be selected. In this case, weights, which are present in the video codec-based weight table and the audio codec-based weight table, and terminal information are taken into consideration.

Referring to FIG. 8, the terminal-based content information table may include related information, video attribute values, and audio attribute values. The related information includes one or more of a comparison result key (Diff_key) 801, a service key (Service_key) 802, a player key (Player_key) 803, a terminal unique key (Dev_unique_id) 804, and a file format (File_format) 805. The video attribute values include one or more of a video codec (V_codec) 806, video mode (V_mode) 807, a video bit rate (V_bit_rate) 808, a video mode VBR (V_mode_vbr) 809, a video frame rate (V_frame_rate) 810, a video resolution (V_resolution) 811, and a video aspect ratio (V_aspect) 812. The audio attribute values include one or more of an audio codec (A_codec) 813, an audio sample rate (A_sample_rate) 814, an audio bit rate (A_bit_rate) 815, and an audio channel (A_channels) 816.

The meanings of the comparison result key 801, the service key 802 and the player key 803 of the codec are similar to those of FIG. 7. The terminal unique key 804 that has been newly added and was absent from FIG. 7 indicates the value required to uniquely identify a terminal, and the file format 805 indicates the file format into which content is to be converted. The video codec 806 indicates a value required to select a codec most suitable for the characteristics of the terminal from among various video codecs supporting the file format 805 in consideration of the video codec weight of the video codec-based weight table. Each of values of the video mode 807, the video resolution 811, and the video aspect ratio 812 is implemented using the corresponding value of FIG. 7. In the case where a plurality of values have been generated, if a default value is present, the default value is used, whereas if a default value is not present, an initial value that appears first is used. In the case of each of the video bit rate 808, the video mode VBR 809, and the video frame rate 810, if the corresponding value of FIG. 7 has been designated as a single value, that value is used. If each corresponding value of FIG. 7 is designated in the form of a range, the median value of the range is used. The audio codec 813 is implemented using a value selected according to the audio codec weight of the audio codec-based weight table. In the case of each of values of the audio sample rate 814 and the audio bit rate 815, if the corresponding value of FIG. 7 has been designated as a singular value, that value is used. If each corresponding value of FIG. 7 is designated in the form of a range, the median value of the range is used. In the case of a value of the audio channel 816, if the value has been designated, the value is used, whereas if the value is not designated, a default value is used.

Figure 9:
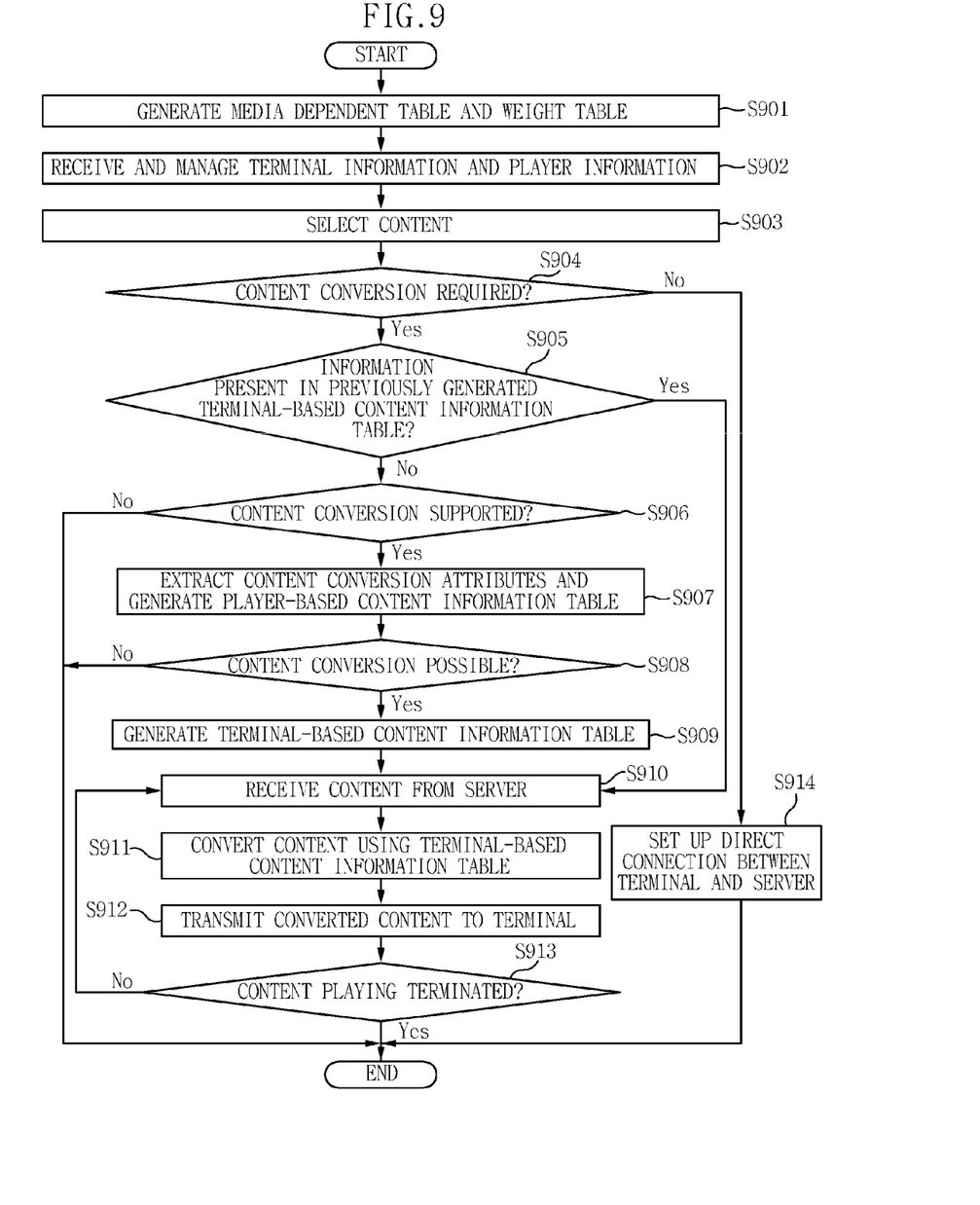
FIG. 9 is a flowchart showing a content conversion method according to an embodiment of the present invention.

FIG. 9 is a flowchart showing a content conversion method according to an embodiment of the present invention.

The content conversion method of FIG. 9 is illustrated as an embodiment. Therefore, all of steps shown in FIG. 9 are not essential steps, and some steps may be modified, added or deleted depending on the circumstances.

Referring to FIG. 9, in the content conversion method according to the embodiment of the present invention, a media dependent table and a weight table are generated at step S901. In this case, the media dependent table may include the file format-based media dependent table, the video codec-based media dependent table, and the audio codec-based media dependent table shown in FIGS. 2 to 4. Further, the weight table may include the video codec-based weight table and the audio codec-based weight table shown in FIGS. 5 and 6. Thereafter, the content conversion apparatus receives information about a terminal and information about the player of the terminal from the terminal and manages the received information at step S902. Next, when the server that provides content receives input from the user and selects content at step S903, whether the conversion of the selected content is required is determined at step S904. If it is determined that the conversion of the selected content is required, whether information about the terminal is present in a previously generated terminal-based content information table is determined at step S905. If it is determined that the information is present, it is considered that the terminal has been previously accessed, and thus the content is received from the server at step S910. The conversion of the content is performed using the previously generated terminal-based content information table at step S911. Thereafter, the process proceeds to steps S912 and S913. If it is determined at step S905 that the information is not present, whether the player of the terminal supports the conversion of the selected content is determined at step S906. If it is determined that the player of the terminal supports the conversion of the selected content, attributes required to convert the content are extracted, and a player-based content information table is generated at step S907. In this case, the player-based content information table may be the player-based content information table of FIG. 7. Thereafter, whether the conversion of the selected content is possible using the attributes of the selected content is determined at step S908. If the conversion of the selected content is possible, a terminal-based content information table is generated at step S909, and the content is received from the server at step S910. In this case, the terminal-based content information table may be the terminal-based content information table of FIG. 8. The content received at step S910 is converted in conformity with the player of the terminal using the terminal-based content information table at step S911, and the converted content is transmitted to the terminal at step S912. Thereafter, whether the playing of the content has terminated is checked at step S913. If the conversion of content is continuously required, content is received from the server at step S910. When the playing of the content has terminated due to the disconnection from the terminal or the termination of content at step S913, the execution of the process is terminated. Further, if conversion of the content is not required at step S904, a direct connection between the terminal and the server is set up at step S914, and the execution of the process is terminated. In contrast, if it is determined at step S906 that the conversion of the selected content is required, but a content conversion function is not supported, the execution of the process is terminated. If it is determined at step S908 that the conversion of the content is impossible, the execution of the process is terminated.

The above-described content conversion method has been described with reference to the flowchart presented in the drawing. Although the method has been shown and described using a series of blocks to simplify the description, the present invention is not limited to the sequence of the blocks. Some blocks may be performed in a sequence different from that shown and described in the present specification with respect to other blocks, or may be simultaneously performed. Furthermore, various different branches, flow paths and block sequences that achieve the same or similar results can be implemented. Further, all blocks shown in the drawings to implement the method described in the present specification may not be necessarily required.

In accordance with an aspect of the present invention, there can be provided a content conversion apparatus and method, which convert content attributes, such as a file format, a video codec and an audio codec that are not supported by a terminal, depending on information about the terminal and information about the player of the terminal and then provide the content of which attributes are converted so that the content attributes are supported by the terminal, thus enabling multimedia content services to be provided regardless of the type of terminals.

The content conversion apparatus and method according to an aspect of the present invention can be utilized to smoothly share content between terminals and to smoothly play and move the content on the terminals. Therefore, the present invention is used in various fields that use multimedia content, such as in Internet Protocol Television (IPTV), Internet education, and Closed Circuit TV (CCTV) security, thus enabling content to be efficiently played without being restricted by the type and performance of terminals.

Although specific embodiments of the present invention have been illustrated and described, it is apparent to those skilled in the art that the technical spirit of the present invention is not limited by the attached drawings and the above description, and various modifications and changes are possible without departing from the spirit and scope of the present invention. It should be understood that these modifications are included in the claims of the present invention without departing from the spirit of the invention.

What is claimed is:

1. A content conversion apparatus, comprising:
 a table generation unit for generating, using a processor, a media dependent table and a weight table including weights assigned based on characteristics of media specified in the media dependent table;
 an information management unit for receiving information about a terminal and information about a player of the terminal from the terminal and managing, using the processor, the received information; and
 a content conversion unit for generating, using the processor, content information tables, related to content that is to be converted, using the media dependent table, the weight table, the terminal information and the player information, and converting the content using the content information table so as to transmit converted content to the terminal,
 wherein using the weight table comprises considering a weight of a video codec and an audio codec in the media dependent table in converting the content.

2. The content conversion apparatus of claim 1, wherein the content conversion unit generates a player-based content information table using the media dependent table, the weight table and the player information, generates a terminal-based content information table using the player-based content information table and the terminal information, and converts the content using the terminal-based content information table.

3. The content conversion apparatus of claim 2, wherein the player-based content information table comprises:
 information including one or more of a comparison result key, a service key, a player key and a file format;
 video attribute values including one or more of the video codec, a weight of the video codec, a video mode, a flag of the video mode, a minimum value, maximum value and flag of a video bit rate, a minimum value, maximum value, and flag of a video mode variable bit rate, a minimum value, maximum value and flag of a video frame rate, a video resolution, a flag of the video resolution, a video aspect ratio, and a flag of the video aspect ratio; and
 audio attribute values including one or more of the audio codec, a weight of the audio codec, a minimum value and maximum value of an audio sample rate, a minimum value and maximum value of an audio bit rate, and an audio channel.

4. The content conversion apparatus of claim 3, wherein:
 the player-based content information table refers to the comparison result key, and
 the comparison result key is a value required to store a difference between an item supported by the player so that the content is played and an item required by a server that provides the content, in a file and to cause the file to be accessed.

5. The content conversion apparatus of claim 2, wherein the player-based content information table is periodically registered, modified or deleted to correspond to registration, modification or deletion of one or more of a service profile, a service comparison rule, a player, a player comparison rule, and a terminal profile.

6. The content conversion apparatus of claim 2, wherein the terminal-based content information table comprises:
   information including one or more of a comparison result key, a service key, a player key, a terminal unique key and a file format;
   video attribute values including one or more of the video codec, a video mode, a video bit rate, a video mode variable bit rate, a video frame rate, a video resolution and a video aspect ratio; and
   audio attribute values including one or more of the audio codec, an audio sample rate, an audio bit rate and an audio channel.

7. The content conversion apparatus of claim 1, wherein the table generation unit generates the media dependent table including a file format-based media dependent table, a video codec-based media dependent table, and an audio codec-based media dependent table, and generates a weight table including a video codec-based weight table and an audio codec-based weight table.

8. The content conversion apparatus of claim 7, wherein the file format-based media dependent table comprises a list of one or more file formats, and also comprises a list of one or more video codecs and a list of one or more audio codecs, wherein the video codecs and the audio codecs support each file format.

9. The content conversion apparatus of claim 7, wherein the video codec-based media dependent table comprises:
   video attribute values including one or more of the video codec, a weight of the video codec, a video mode, a flag of the video mode, a minimum value, maximum value and flag of a video bit rate, a minimum value, maximum value and flag of a video mode variable bit rate, a minimum value, maximum value and flag of a video frame rate, a video resolution, a flag of the video resolution, a video aspect ratio, and a flag of the video aspect ratio;
   audio attribute values including one or more of the audio codec and a flag of the audio flag; and
   file format attribute values including one or more of a file format and a flag of the file format.

10. The content conversion apparatus of claim 7, wherein the audio codec-based media dependent table comprises audio attribute values including one or more of the audio codec, a weight of the audio codec, a minimum value and maximum value of an audio sample rate, a minimum value and maximum value of an audio bit rate, and a number of audio channels, a file format, and the video codec.

11. The content conversion apparatus of claim 7, wherein the video codec-based weight table comprises one or more of information about being free or charged for, a weight related to being free or charged for, a number of supportable file formats, and a weight related to the number of supportable file formats.

12. The content conversion apparatus of claim 7, wherein the audio codec-based weight table comprises one or more of information about being free or charged for, a weight related to being free or charged for, a number of supportable file formats, and a weight related to the number of supportable file formats.

13. The content conversion apparatus of claim 1, further comprising a content conversion determination unit for determining whether conversion of content selected by a server, which receives input from a user and provides the content, is required, whether the conversion of the content is supported, and whether the conversion of the content is possible.

14. A content conversion method, comprising:
   generating, using a processor, a media dependent table and a weight table including weights assigned based on characteristics of media specified in the media dependent table;
   receiving information about a terminal and information about a player of the terminal from the terminal and managing the received information;
   generating, using the processor, content information tables, related to content that is to be converted, using the media dependent table, the weight table, the terminal information and the player information;
   converting, using the processor, the content using the content information table; and
   transmitting converted content to the terminal,
   wherein in generating the content information tables, using the weight table comprises considering a weight of a video codec and an audio codec in the media dependent table in converting the content.

15. The content conversion method of claim 14, wherein the converting the content comprises:
   generating a player-based content information table using the media dependent table, the weight table and the player information;
   generating a terminal-based content information table using the player-based content information table and the terminal information; and
   converting the content using the terminal-based content information table.

16. The content conversion method of claim 14, wherein the generating the media dependent table and the weight table comprises:
   generating a media dependent table including a file format-based media dependent table, a video codec-based media dependent table, and an audio codec-based media dependent table; and
   generating a weight table including a video codec-based weight table and an audio codec-based weight table.

17. The content conversion method of claim 14, further comprising, after the receiving the terminal information and the player information of the terminal from the terminal and managing the received information:
   at a server that provides the content, receiving input from the user and selecting the content;
   determining whether conversion of the selected content is required; and
   if it is determined that the conversion of the selected content is not required, setting up a direct connection between the terminal and the server, and terminating execution of the method.

18. The content conversion method of claim 17, further comprising, if it is determined that the conversion of the selected content is required:
   determining whether information about the terminal is present in a previously generated terminal-based content information table, and if it is determined that the terminal information is present, receiving the content from the server and proceeding to the converting the content, whereas if it is determined that the terminal information is not present, determining whether the player of the terminal supports conversion of the selected content; and if it is determined that the player of the terminal does not support the conversion of the selected content, terminating execution of the method.

19. The content conversion method of claim 18, further comprising, if it is determined that the player of the terminal supports the conversion of the selected content:

extracting attributes of the selected content required to convert the selected content;

determining whether the conversion of the selected content is possible using the attributes of the selected content; and if it is determined that the conversion of the selected content is impossible, terminating execution of the method, whereas if the conversion of the selected content is possible, proceeding to the generating the content information table.

20. The content conversion method of claim 14, further comprising, after transmitting the converted content to the terminal:

playing the transmitted content;

determining whether playing of the transmitted content has terminated;

if it is determined that the playing of the transmitted content has terminated, terminating execution of the method.

\* \* \* \* \*